United States Patent
Gandhi (10) Patent No.: US 11,206,004 B1
(45) Date of Patent: Dec. 21, 2021

(54) AUTOMATIC EQUALIZATION FOR CONSISTENT HEADPHONE PLAYBACK

(71) Applicant: Apple Inc., Cupertino, CA (US)

(72) Inventor: Navneet Gandhi, Santa Clara, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/023,340

(22) Filed: Sep. 16, 2020

(51) Int. Cl.
| H04R 1/10 | (2006.01) |
| H04R 3/00 | (2006.01) |
| G10K 11/16 | (2006.01) |
| H03G 5/16 | (2006.01) |
| G10K 11/178 | (2006.01) |

(52) U.S. Cl.
CPC ............ *H03G 5/165* (2013.01); *G10K 11/178* (2013.01); *H04R 1/10* (2013.01); *H04R 3/00* (2013.01)

(58) Field of Classification Search
CPC . H04R 3/00; H04R 3/005; H04R 3/04; H04R 1/10; H04R 1/1016; H04R 1/1083; G10K 11/178; G10K 11/1785; G10K 11/17853; G10K 11/17854; G10K 2210/1081; G10K 2210/3014; G10L 21/02; G10L 21/0208; G10L 21/02165; H03G 5/165
See application file for complete search history.

(56) References Cited

U.S. PATENT DOCUMENTS

| 5,359,665 | A | 10/1994 | Werrbach |
| 7,016,509 | B1 | 3/2006 | Bharitkar et al. |
| 7,171,010 | B2 | 1/2007 | Martin et al. |
| 8,275,152 | B2 | 9/2012 | Smirnov et al. |
| 8,693,700 | B2 | 4/2014 | Bakalos et al. |
| 9,264,823 | B2 | 2/2016 | Bajic et al. |
| 9,515,629 | B2 | 12/2016 | Goldstein et al. |
| 10,034,092 | B1 | 7/2018 | Nawfal et al. |
| 10,074,903 | B2 * | 9/2018 | Kim ................... H01Q 13/103 |
| 2003/0145025 | A1 | 7/2003 | Allred et al. |

(Continued)

FOREIGN PATENT DOCUMENTS

EP 2239728 10/2010

OTHER PUBLICATIONS

Notice of Allowance for U.S. Appl. No. 17/019,778 dated Jun. 24, 2021, 18 pages.

(Continued)

*Primary Examiner* — Thang V Tran
(74) *Attorney, Agent, or Firm* — Womble Bond Dickinson (US) LLP (57) ABSTRACT

Automatic equalization for consistent headphone may take place in a playback mode of operation in which ANC is turned off and there is no direct feedback from an internal microphone (to the input of a speaker). An automatic user content equalization process is active during that mode of operation which adapts a filter AEQ to restore a flat or other desired frequency response at the output of the speaker despite variation in headphone fit. An estimate of a transfer function of a path S is determined, wherein the path S is from i) the input of the speaker of the headphone to the internal microphone signal. The filter AEQ is adapted based on the estimate of the transfer function of the path S while it filters user content audio that drives the input of the speaker of the headphone. Other embodiments are also described and claimed.

20 Claims, 6 Drawing Sheets

(56) References Cited

U.S. PATENT DOCUMENTS

| | | | |
|---|---|---|---|
| 2004/0032959 A1 | 2/2004 | Montag et al. | |
| 2008/0175409 A1 | 7/2008 | Lee et al. | |
| 2010/0195815 A1* | 8/2010 | Tada | H04M 9/082 |
| | | | 379/406.01 |
| 2011/0007907 A1* | 1/2011 | Park | G10K 11/17881 |
| | | | 381/71.8 |
| 2011/0142247 A1* | 6/2011 | Fellers | G10K 11/17875 |
| | | | 381/71.1 |
| 2013/0259250 A1* | 10/2013 | Nicholson | G10K 11/17885 |
| | | | 381/71.6 |
| 2014/0093090 A1 | 4/2014 | Bajic et al. | |
| 2014/0341388 A1* | 11/2014 | Goldstein | G10K 11/17854 |
| | | | 381/71.11 |
| 2016/0300562 A1 | 10/2016 | Goldstein | |
| 2018/0047383 A1* | 2/2018 | Hera | G10K 11/178 |
| 2019/0130930 A1 | 5/2019 | Tong et al. | |
| 2020/0098347 A1* | 3/2020 | Kubota | G10K 11/17885 |
| 2020/0374617 A1* | 11/2020 | Liu | H04R 1/1016 |
| 2021/0097970 A1 | 4/2021 | Saux et al. | |
| 2021/0099799 A1 | 4/2021 | Saux et al. | |

OTHER PUBLICATIONS

"Bose QuietComfort Earbuds", Retrieved from the Internet <https://www.bose.com/en_us/products/headphones/earbuds/quietcomfort-earbuds.html#v=qc_earbuds_black, Sep. 10, 2020, 15 pages.

Bristow-Johnson, Robert, "Cookbook formulae for audio equalizer biquad filter coefficients", Retrieved from the Internet <https://www.w3.org/2011/audio/audio-eq-cookbook.html>, May 29, 2020, 7 pages.

Non-Final Office Action for U.S. Appl. No. 17/019,774 dated Oct. 22, 2021, 8 pages.

\* cited by examiner

AUTOMATIC EQUALIZATION FOR CONSISTENT HEADPHONE PLAYBACK

FIELD

An aspect of the disclosure here relates to digital signal processing techniques for improving playback performance in headphones. Other aspects are also described.

BACKGROUND

Headphones let their users listen to music and participate in phone calls without disturbing others who are nearby. They are used in both loud and quiet ambient environments. Headphones can have various amounts of passive sound isolation against ambient noise. There may be in-ear rubber tips, on-ear cushions, or around-the-ear cushions, or the sound isolation may be simply due to the against the ear headphone housing loosely blocking the entrance to the ear canal. Audio quality and fidelity are top concerns for good headphone design. The characteristics of audio playback as heard by the ear drum can vary significantly depending on how the headphones fit on or in the user's ear, due to leakage of sound and interaction of pinna with the incident sound field. This often leads to an inconsistent user experience, unintended bass response and doesn't allow for the intent of the artist to be reproduced faithfully at the listener's end.

SUMMARY

One aspect of the disclosure here is an audio signal processing method that improves the consistency of playback performance despite variation in headphone fit. In such a method, a transfer function of a path from i) an input of a speaker of the headphone to an internal microphone signal, is determined. The transfer function is updated repeatedly or periodically during playback, by an adaptive filter algorithm on a per audio frame basis, while a user content audio signal is driving the input of the speaker of the headphone. The user content audio signal that is driving the input of the speaker of the headphone is being filtered, by a filter cascade that comprises a first filter and a second filter. The second filter and not the first filter is being adapted in real-time, while the filter cascade is filtering the user content audio signal that is driving the input of the speaker of the headphone, based on the updated transfer function. In this manner, consistency in playback is achieved despite variation in headphone fit.

An adaptive digital filter AEQ is added to a playback audio path of a headphone system, wherein the playback signal path may be from digital music data arriving on a device through a wireless link such as a Bluetooth link or through a wired audio cable, to a speaker of the headphone. A path S is defined from the input of the speaker to the output of the internal microphone. The playback path contains another filter Media EQ, that represents the fit-independent portion of the equalization or spectral shaping that balances the different frequency components of the audio signal to lend a desirable shape to its audio spectrum. The filter AEQ is cascaded with the filter Media EQ. In one aspect, the filter AEQ is designed to operate over a wide audio frequency band, e.g., 10 Hz to 10 kHz, not just in a low frequency band where for example acoustic noise cancellation is typically effective. The system adapts the filter AEQ online, based on an online estimate of the transfer function of the path S. In this manner, the addition of the filter AEQ helps the audio playback subsystem to deliver a more consistent sound profile despite variation in how the headphone fits the ear, and between users with varying ear geometries.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

In various aspects, the description here is made with reference to figures. However, certain aspects may be practiced without one or more of these specific details, or in combination with other known methods and configurations. The aspects are thus illustrated by way of example and not by way of limitation in the figures in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

In the following description, numerous specific details are set forth, such as specific configurations, dimensions, and processes, in order to provide a thorough understanding of the embodiments. In other instances, well-known processes and manufacturing techniques have not been described in particular detail in order to not unnecessarily obscure the description. Reference throughout this specification to "one embodiment," "an embodiment," or the like, means that a particular feature, structure, configuration, or characteristic described is included in at least one embodiment. Thus, the appearance of the phrase "one embodiment," "an embodiment," or the like, in various places throughout this specification are not necessarily referring to the same embodiment. Furthermore, the particular features, structures, configurations, or characteristics may be combined in any suitable manner in one or more embodiments.

Figure 1:
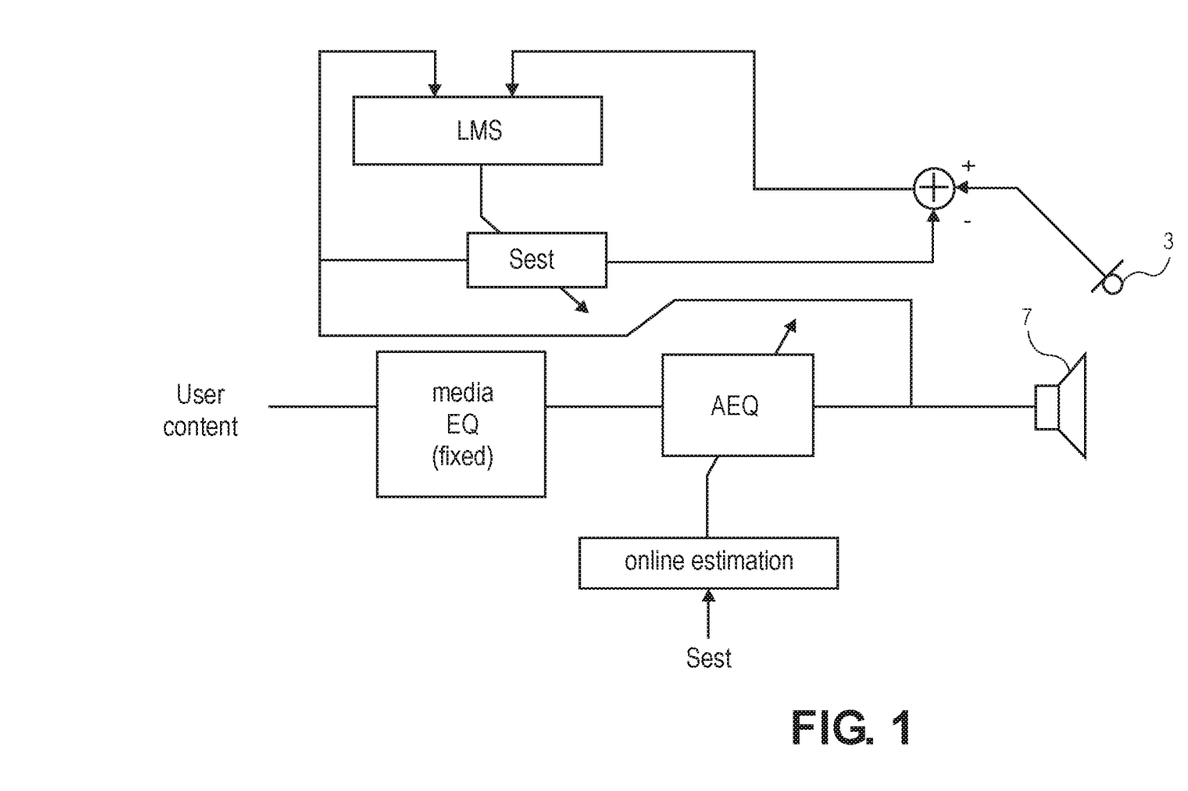
FIG. 1 is a block diagram of part of a headphone audio system in which online adaptive filtering of the user content audio is taking place.

FIG. 1 shows a block diagram of part of a headphone audio system (headphone) that can be worn by its user or wearer against their ear (not shown), and in which the systems and methods for digital audio signal processing described below can be implemented. The headphone may be an in-ear earbud, such as a sealing-type that has a flexible ear tip that serves to acoustically seal off the entrance to the user's ear canal from the ambient environment by blocking or occluding in the ear canal (thereby achieving strong passive ambient sound isolation), or it may be a looser fitting earbud. The headphone may be one of two headphones (left and right) that make up a headset. The methods described below can be implemented in one or both of the headphones that make up a headset. Alternatives to an in-ear earbud include a closed back, on-the-ear headphone or an over-the-ear headphone that could also create a strong, passive ambient sound barrier. In all such instances, the way in which the headphone fits the wearers ear affects how a pocket of air is trapped at the ear and this affects how the wearer of the headphone can hear sound produced by a speaker in the headphone.

The headphone has integrated therein an against-the-ear acoustic transducer or speaker 7 arranged or configured to reproduce sound that is represented in an input digital audio signal, directly into the ear of a wearer (user.) There is also an internal microphone 3 that is arranged or configured to directly receive the sound reproduced by the speaker 7. In some instances, the headphone also has integrated therein an external microphone 5 shown in FIG. 6 discussed below, which is arranged or configured to receive ambient sound directly. The headset is configured to acoustically couple the external microphone 5 to an ambient environment of the headphone, in contrast to the internal microphone 3 being acoustically coupled to a trapped volume of air within the ear that is being blocked by the headphone. In one variation, as integrated in the headphone and worn by its user, the external microphone 5 may be more sensitive than the internal microphone 3 to a far field sound source outside of the headphone. Viewed another way, as integrated in the headphone and worn by its user, the external microphone may be less sensitive than the internal microphone 3 to sound within the user's ear.

In one aspect, along with the microphones there is other electronics that may be integrated in the headphone housing including a microphone sensing and conversion circuit that receives the microphone signal from the internal microphone 3 converts it into a desired format for digital signal processing, an audio amplifier to drive the speaker 7 based on a digital input audio signal, and a digital processor and associated memory (not shown separately) where the memory stores instructions for configuring or programing the processor (e.g., instructions to be executed by the processor) to perform the digital signal processing methods that are described below and shown in blocks in the figures. A playback or user content audio signal (program audio) that may contain user content such as music, podcast, or the voice of a far end user during a voice communication session is also be provided to drive the speaker 7 during playback mode. The user content signal may be provided to the processor over a wired or wireless communication link from an external, companion audio source device (not shown in the example of FIG. 1) such as a smartphone or a tablet computer, or from a remote server over the Internet or through a cellular network communications interface that is within the housing of the headphone.

Still referring to FIG. 1, in the headphone audio system the method for audio signal processing is performed for the most part "online", that is in real-time by a processor (such as one that is integrated in the headphone housing) while the headphone is being worn by its owner (wearer or user) for its intended use in either a headphone playback mode (user content signal is loud) or in an active ear plug mode (in which the user content signal is quiet.) This is contrast to certain operations described below which may be performed "offline", that is not during the intended use, e.g., during a power on self-test of the headphone, a software update, or at the factory before the headphone has been shipped to its owner.

In the headphone audio system of FIG. 1, online, adaptive filtering of the user content audio is taking place, by an adaptive digital filter AEQ while the user content audio signal is driving an input of the speaker 7. In one aspect, this takes place in a mode of operation in which an ANC subsystem (not shown in FIG. 1) is turned off (e.g., no anti-noise is being produced by the headphone and in particular by the speaker 7) and there is no feedback path from the internal microphone 3 directly to the input of the speaker driver 7. In another aspect, described below in connection with FIG. 6, the adaptive filtering by the filter AEQ occurs while feedforward ANC is active.

The filter AEQ is being adapted by an online estimation block. The online estimation block adjusts the filter AEQ based on a computed estimate of the transfer function of the path S, referred to here as Sest. The transfer function Sest is also being updated online, using for example a least means squares, LMS, engine for which the user content audio is the stimulus as shown. In one aspect, the filter AEQ is computed (by the online estimation algorithm) as simply an inverse of the adaptively updated transfer function Sest. This adaptation of the filter AEQ should remove any undesired variation in frequency response at the output of the speaker 7, despite variation in headphone fit against the user's ear, since the addition of the fixed filter media EQ (which is in cascade with the filter AEQ) is expected to produce a flat or other desired shape in the spectrum of the audio signal that is driving the input of the speaker 7. The filter media EQ may be maintained fixed relative to the adaptively updated filter AEQ (its transfer function does not change on a per audio frame basis or changes slowly. unlike the filter AEQ which is contemporaneously being adapted on a per audio frame basis based on the updated transfer function Sest.

The filter AEQ may be adapted using for example the following techniques. These include performing a least squares estimation to directly produce the digital filter coefficients of the filter AEQ, where the transfer function of the filter AEQ is being altered (as it is being updated) for example over the full audio band, e.g., from 10 Hz to 10 kHz. In one aspect, a number of template functions are used to compute the digital filter coefficients. The filter AEQ may be defined to be composed of a number of infinite impulse response biquad filters coupled in cascade, wherein every one of the biquad filters is updated based on the same instance of the (updating) transfer function of the path S. In one aspect, the filter AEQ as it is being updated has a transfer function that is an inverse of a minimum phase version of the transfer function Sest.

The filter mediaEQ and the filter AEQ are coupled to each other in cascade, in a path that brings the user content audio to the input of the speaker 7. The order in which the filter mediaEQ and the filter AEQ are coupled to each other in cascade may be reversed. The filter mediaEQ is a digital filter that may be fixed in that its filter coefficients do not vary dynamically on a per audio frame basis (where each digital audio frame may for example be 5 msec-10 msec long.) The filer mediaEQ may vary slowly, for example at least every three seconds. It may be determined offline and may be a function of the initial spectral content of the user content audio. In contrast, the processor adapts the second filter AEQ online and dynamically, for example every one or two audio frames whenever an estimate of the transfer function of the path S is updated. FIG. 1 shows an example of how the estimate of the transfer function of the path S, Sest, can be dynamically updated online by an adaptive filter engine such as a least mean squares, LMS, engine, based on the error or difference between i) an Sest-filtered version of an audio signal that is driving the speaker 7 (e.g., user content audio) and the audio signal after it has passed through the path S.

Figure 2:
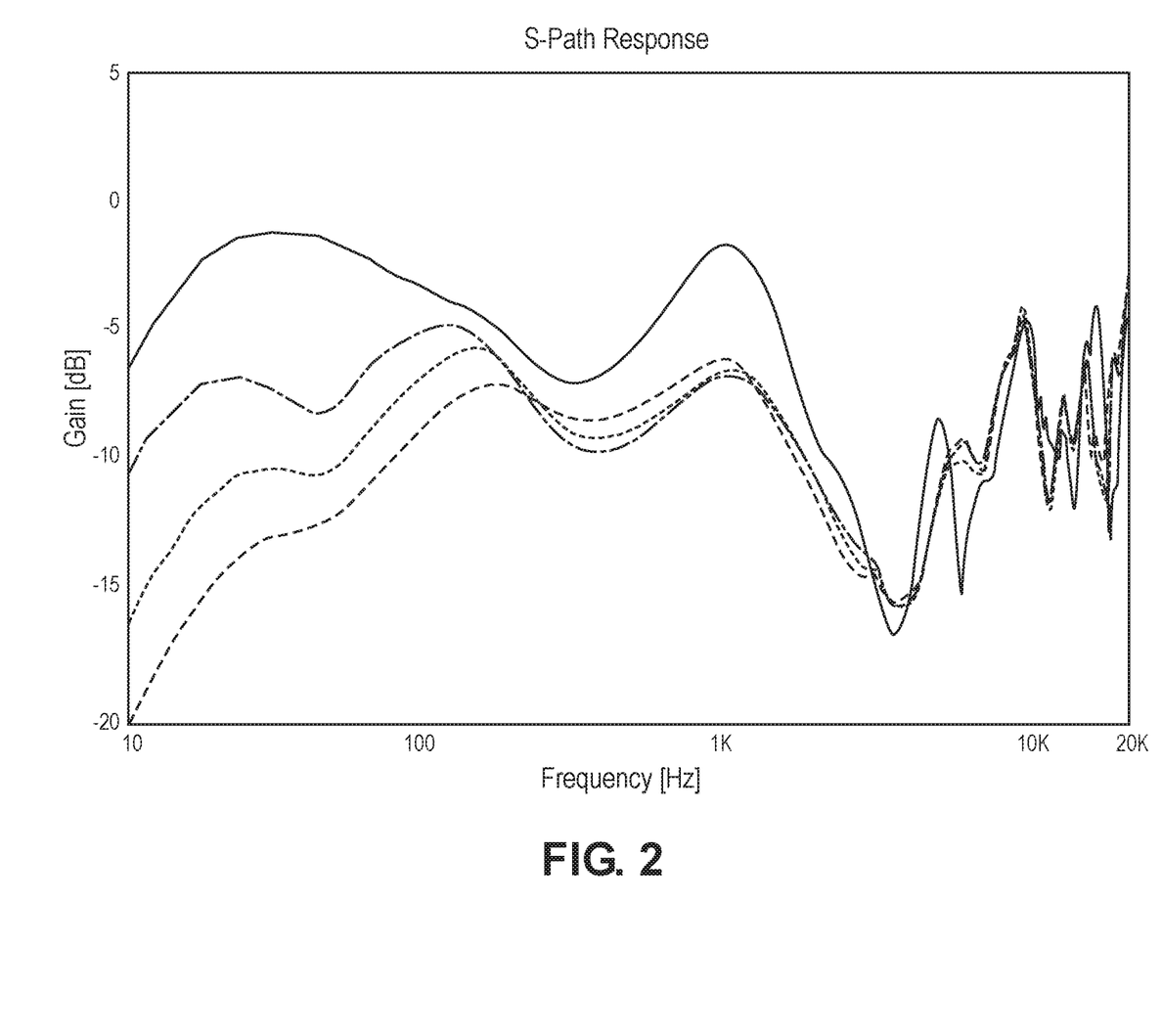
FIG. 2 shows an example of variation in the transfer function of the path S in a headphone audio system, across users with varying fit between a headphone and the users' ear.

Motivation for the method of FIG. 1 may be appreciated by considering how the path S transfer function varies across different users and different instances of the fit of the headphone against a particular user's ear, as depicted by the four curves in FIG. 2. It can be seen that at 100 Hz there is about 15 dB variation between a tightly fitting version and a loosely fitting version of the headphone (and where the graph also shows two intermediate fits.) If the cascade of filters mediaEQ, AEQ were replaced with a fixed filter, F, then the illustrated variation in the path S would result in low audio quality or fidelity that might be heard by the wearer. The solution depicted in FIG. 1 automatically adapts the filter AEQ as required, depending on the fit of the headphone which may be represented by Sest to thereby maintain the desired spectral shape at the output of the fixed filter mediaEQ which is output as sound by the speaker 7 that is being heard by the wearer.

The filtering being applied to the user content audio may be divided into two parts, namely the filter mediaEQ which may be a fixed filter that applies a gain to provide the desired spectral shaping based on the initial spectrum of the user content audio, and the filter AEQ which may be the inverse of the shape of the gain response of the path S, or an inverse of a minimum phase version of the transfer function S, $S_{mp}^{-1}$. This means that the product, $S_{mp}^{-1}*S_{median}$, where $S_{median}$ is an ideal transfer function or an average of many users and fits, is flat in frequency domain. Adapting the filter AEQ therefore calls for adapting $S_{mp}^{-1}$, by computing its filter coefficients in real time, e.g., on a per audio frame basis, using an estimation algorithm (performed by the processor as configured according to the online estimation block shown in FIG. 1.)

Figure 3:
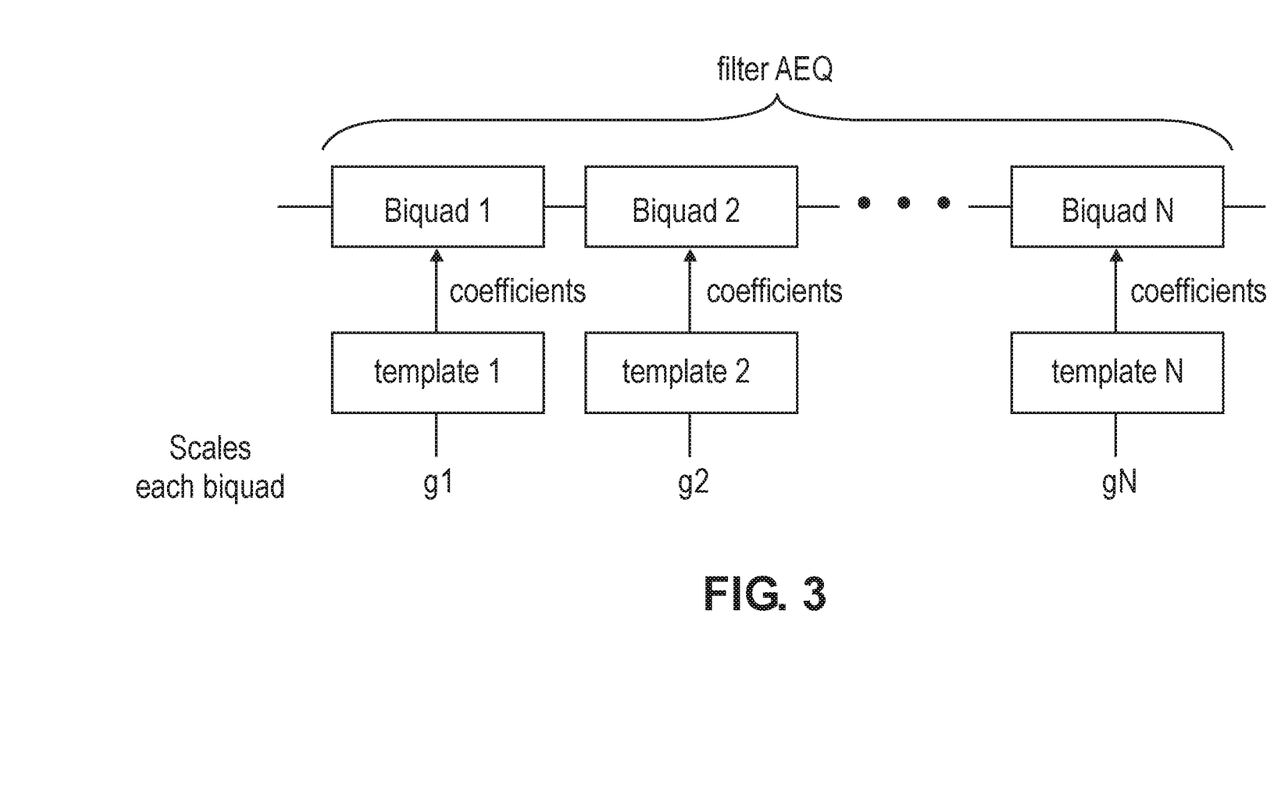
FIG. 3 shows an example implementation of the filter AEQ using a cascade of biquads.
Figure 4:
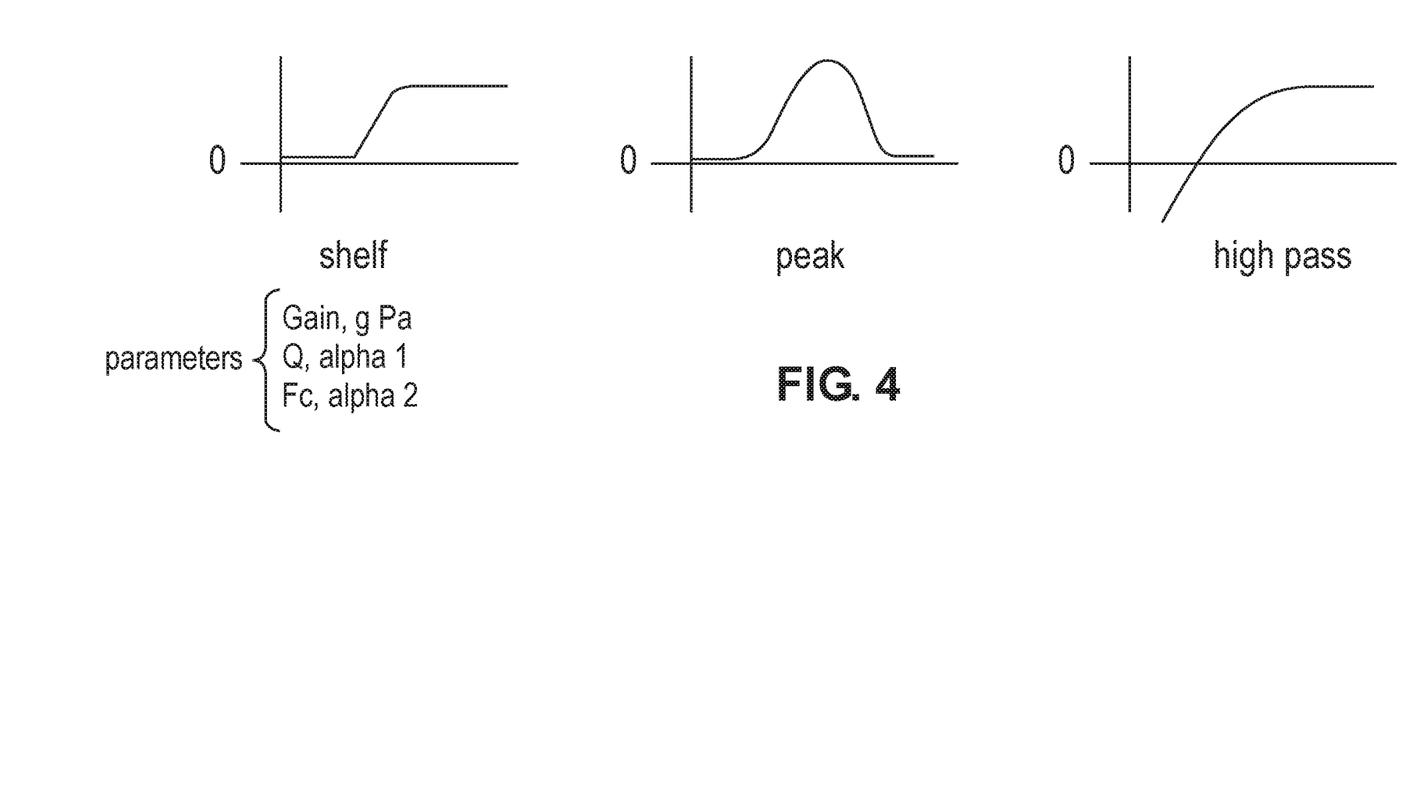
FIG. 4 shows an example set of three templates that can be used to compute the coefficients of the biquads.

The online estimation algorithm to compute the filter AEQ may be as follows. The filter AEQ is modeled as several, infinite impulse response biquads coupled in cascade (series) as shown in FIG. 3. A least squares estimation process is performed to directly compute the filter coefficients of each biquad, where directly computing the coefficient is in contrast to performing a table look up to select a set of previously determined filter coefficients. In particular, the coefficients of each biquad are calculated using a biquad template function as depicted in FIG. 3. The template function may have the following properties: it is parametric (can be computed using a handful of parameters such as quality factor, Q, of a two-pole resonator (alpha1) and cut off frequency or center frequency, Fc (alpha2); it is scalable in the cepstral domain according to a gain parameter, g, that scales their real cepstrum linearly; and it is minimum phase. Examples of such templates are a shelf filter, a peak filter and a high pass filter as shown in FIG. 4. Other template combinations are possible. Note that the templates and their parameters alpha1 and alpha2 may be determined in an offline process and then stored in memory inside the headphone housing for use by the online estimation process. The gain parameters, g, however are computed online and in real-time as described below (using the estimate, Sest, of the transfer function of the path S), and then applied to scale the templates which are then used to compute the biquad coefficients.

Note that this online estimation process may result in altering the transfer function of the second filter AEQ over a wide frequency band, from 10 Hz to 10 kHz. Every one of the biquad filters is updated based on a same estimate of the transfer function of the path S. In this manner, the resulting filter AEQ is able to correct the frequency response of the headphone audio system (as is being heard by its wearer) to be more consistent across different users (despite variations in their respective headphone fits.)

Figure 5:
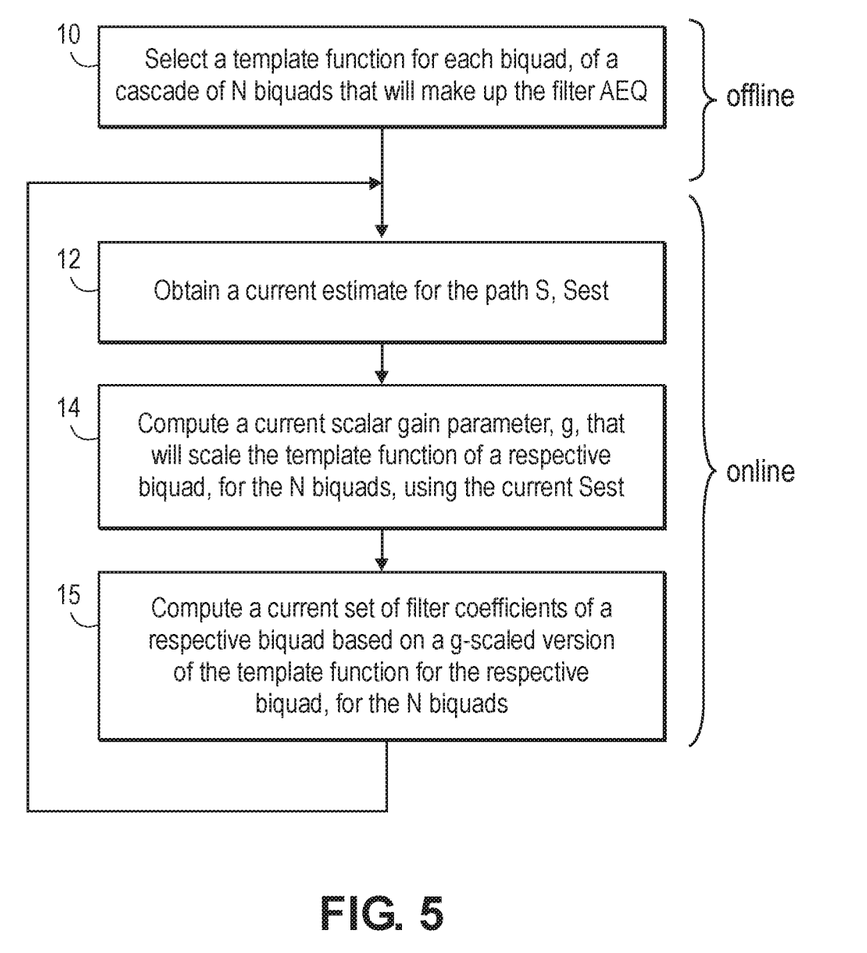
FIG. 5 is a flow diagram of an audio signal processing method for a headphone audio system.

FIG. 5 is a flow diagram an audio signal processing method for a headphone audio system, in which a processor adapts the N biquads (N being two or more) that make up the second filter AEQ by determining a least squares fit of the estimate of the transfer function of the path S using template functions, and computes the filter coefficients of the biquads based on the least squares fit (collectively the online estimation block in FIG. 1.) Prior to the online estimation method though, there is operation 10 in which a template function is selected for each biquad. As explained below, operation 10 may be performed offline and the resulting selected template functions can then be stored in memory ready for the processor to use in its online estimation process (when user content playback is activated.) The online process can be viewed as a loop that may be repeated each time a current estimate for the path S, Sest, is obtained (operation 12.) As explained above and shown in FIG. 1, this may be performed by an LMS engine which computes digital filter coefficients Sest online while the user is wearing the headphone and some stimulus input audio signal, e.g., the user content or playback signal, is being output through the speaker 7.

Returning to FIG. 5, the process then continues with operation 14, computing a current scalar gain parameter, g, that will scale the template function of a respective biquad—see FIG. 3, a vector of gain parameters g1, g2, ... gN. A set of linear equations may be solved to obtain the vector of gain parameters g1, g2, ... gN, represented as G=P*Sest where P is a matrix inverse or pseudo inverse of a matrix that is composed of the individual template functions given in frequency domain format, and Sest is a vector of imaginary values of the transfer function of the path S. Finally, in operation 15, a current set of filter coefficients of a respective biquad is computed, based on a g-scaled version of the template function for the respective biquad, for the N biquads—see FIG. 3. This results in the cascade of the N biquads which is the filter AEQ in FIG. 1 to be updated. The method loops back and resumes with operation 12, when a new current estimate for the path S becomes available.

Regarding the template function selection in operation 10, recall that a goal of the cascade of biquads and their respective gain parameters g1, g2, ... gN is to flatten the overall response of the path (see FIG. 1) despite changes in headphone fit that affect Sest. When the biquads imperfectly match the inverse of Sest, a cost function can be written that may be optimized by finding a set of biquad templates that minimizes this cost function across all expected headphone fit variations (across various users.) Any one of several nonlinear optimization procedures may be used to find a set of biquad template functions (and their associated parameters.)

Figure 6:
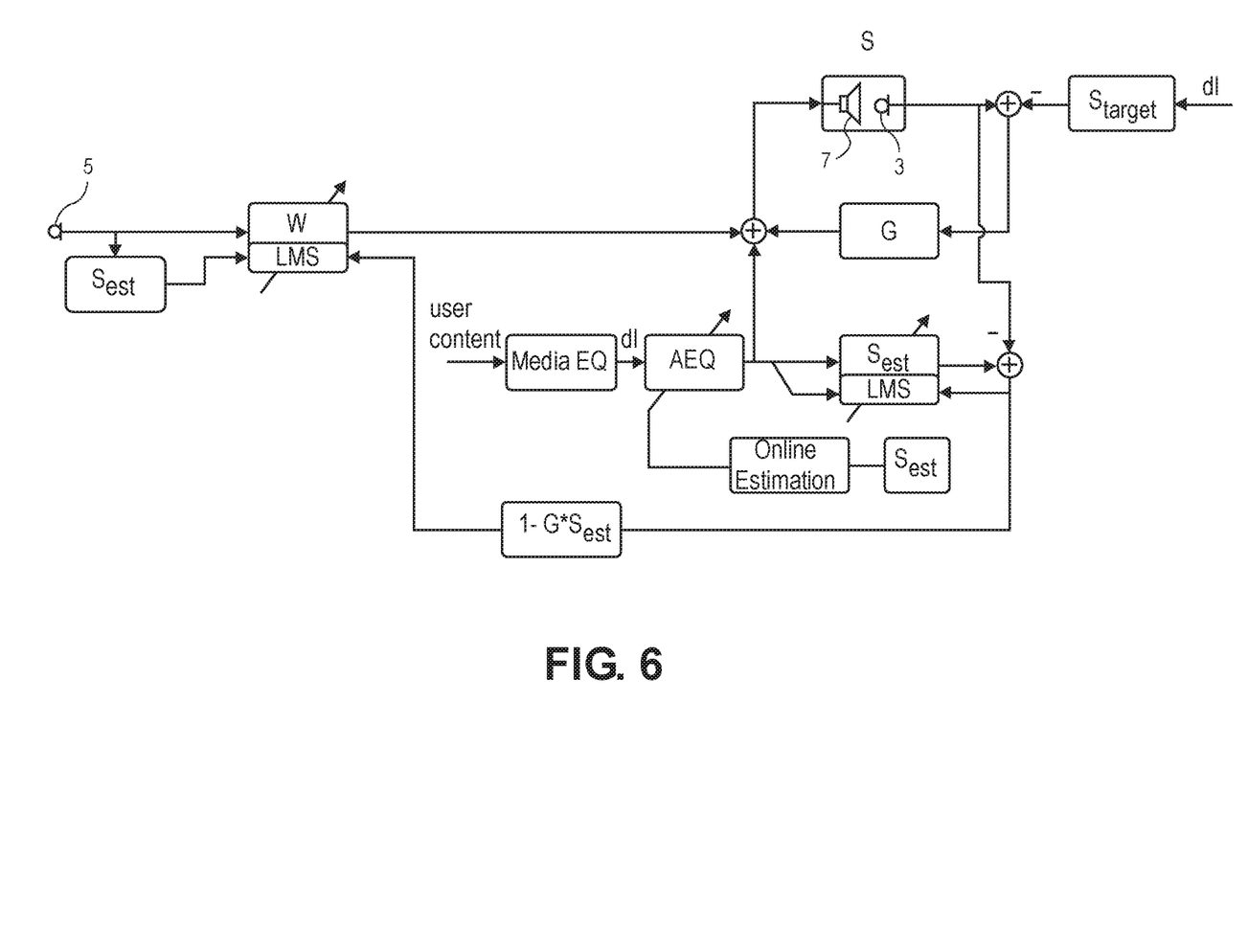
FIG. 6 is a block diagram of a headphone audio system that performs adaptive filtering of user content during playback, combined with adaptive feedforward ANC.

Turning now to FIG. 6, this is a block diagram of part of a headphone audio system that performs adaptive filtering of user content during playback, combined with adaptive feedforward ANC. The system has an external microphone 5

(one or more external microphones 5) which produces an external microphone signal of the headphone that is filtered by filter W to produce a feedforward audio signal for driving the input of the speaker 7. The feedforward audio signal may be an anti-noise signal and the filter W in this case is being adapted online. The filter W may be adapted by an LMS engine, based on the current estimate of the transfer function of path S, Sest, and based on the residual noise as picked up by the internal microphone 3.

The residual noise signal is produced by removing directly from the internal microphone signal a signal dl that is produced by filtering the user content audio through a fixed or slow changing filter mediaEQ, and then compensating for the presence of a feedback filter G by applying a filter 1-G*Sest. The feedback filter G may be fixed (as compared to online adaptation that occurs on a per audio frame basis) and produces a feedback audio signal from the internal microphone signal, which may in some cases then be combined with the feedforward audio signal and the user content audio signal for driving the input of the speaker 7.

The fixed or slow changing filter mediaEQ is performing equalization or other desired spectral shaping upon the user content audio as described above in connection with FIG. 1. Its output dl is then filtered by the adaptive filter AEQ which is in cascade with the filter mediaEQ as shown and serves to enable more consistent playback sounds for the wearer of the headphone system despite variation in how the headphone fits against the wearers ear.

While certain aspects have been described above and shown in the accompanying drawings, it is to be understood that such descriptions are merely illustrative of and not restrictive on the invention, and that the invention is not limited to the specific constructions and arrangements shown and described, since various other modifications may occur to those of ordinary skill in the art. For example, although FIG. 5 shows a loop that is repeated each time there is a current estimate of path S, the loop does not have to use each and every current estimate of path S that is computed for each and every audio frame—some instances of the current estimate of the path S may be skipped by the online estimation process. Furthermore, the particular features, structures, configurations, or characteristics may be combined in any suitable manner in one or more embodiments.

What is claimed is:

1. An audio signal processing method for a headphone, the method comprising:
   determining a transfer function of a path from i) an input of a speaker of the headphone to ii) an internal microphone signal, and updating the transfer function by an adaptive filter algorithm on a per audio frame basis while a user content audio signal is driving the input of the speaker of the headphone;
   filtering the user content audio signal that is driving the input of the speaker of the headphone, by a filter cascade that comprises a first filter and a second filter; and
   adapting the second filter and not the first filter while the filter cascade is filtering the user content audio signal that is driving the input of the speaker of the headphone, based on the updated transfer function.

2. The method of claim 1 wherein while the user content audio signal is driving the input of the speaker, no anti-noise is being produced by the headphone and there is no feedback path from an internal microphone of the headphone directly to the input of the speaker of the headphone.

3. The method of claim 1 further comprising performing acoustic noise cancellation using the speaker while the user content audio signal is driving the speaker.

4. The method of claim 3 further comprising:
   filtering an output of the first filter to produce a contribution by the user content audio signal; and
   removing the contribution from the internal microphone signal.

5. The method of claim 1 wherein adapting the second filter comprises altering a transfer function of the second filter from 10 Hz to 10 kHz.

6. The method of claim 1 wherein the second filter comprises a plurality of infinite impulse response biquad filters coupled in cascade, and wherein every one of the biquad filters is updated based on a same instance of the transfer function of the path.

7. The method of claim 6 wherein the second filter has a transfer function that is an inverse of a minimum phase version of the transfer function of the path.

8. The method of claim 1 wherein adapting the second filter and not the first filter comprises maintaining the first filter fixed while adapting the second based on the updated transfer function.

9. A headphone audio system comprising:
   a headphone housing having integrated therein an internal microphone to produce an internal microphone signal, and a speaker;
   a processor; and
   memory having stored therein instructions that configure the processor to
      determine a transfer function of a path from i) an input of a speaker of the headphone to an internal microphone signal, and update the transfer function by an adaptive filter algorithm on a per audio frame basis while a user content audio signal is driving the input of the speaker of the headphone,
      filter the user content audio signal that is driving the input of the speaker of the headphone, by a filter cascade that comprises a first filter and a second filter, and
      adapt the second filter and not the first filter based on the updated transfer function while the filter cascade is filtering the user content audio signal.

10. The headphone audio system of claim 9 wherein the processor and memory are integrated in the headphone housing.

11. The headphone audio system of claim 9 wherein the second filter comprises a plurality of biquads, and the processor adapts the second filter by i) determining a least squares fit of the transfer function of the path using a plurality of template functions, and computing filter coefficients of the biquads based on the least squares fit.

12. The headphone audio system of claim 9 wherein processor adapts the second filter by altering a transfer function of the second filter from 10 Hz to 10 kHz.

13. The headphone audio system of claim 9 wherein while the user content audio signal is driving the input of the speaker, no anti-noise is being produced by the headphone and there is no feedback path from the internal microphone directly to the input of the speaker.

14. The headphone audio system of claim 9 wherein the second filter comprises a plurality of infinite impulse response biquad filters coupled in cascade, and wherein every one of the biquad filters is updated based on a same instance of the transfer function of the path.

15. The headphone audio system of claim 9 wherein the second filter has a transfer function that is an inverse of a minimum phase version of the transfer function of the path.

16. An article of manufacture comprising
a non-transitory machine readable medium having stored therein instructions that configure a processor to:
determine a transfer function of a path from i) an input of a speaker of a headphone to an internal microphone signal of the headphone, and update the transfer function by an adaptive filter algorithm on a per audio frame basis while a user content audio signal is driving the input of the speaker of the headphone;
filter the user content audio signal that is driving the input of the speaker of the headphone, by a filter cascade that comprises a first filter and a second filter; and
adapt the second filter and not the first filter while the filter cascade is filtering the user content audio signal that is driving the input of the speaker of the headphone, based on the updated transfer function.

17. The article of manufacture of claim 16 wherein the second filter comprises a plurality of biquads, and adapting the second filter comprises:

computing a plurality of gain parameters using the transfer function;
scaling a plurality of template functions by the plurality of gain parameters, respectively; and
computing filter coefficients of the plurality of biquads based on scaling the plurality of template functions.

18. The article of manufacture of claim 16 wherein adapting the second filter comprises performing a least squares estimation to directly produce digital filter coefficients of the second filter.

19. The article of manufacture of claim 16 wherein adapting the second filter comprises
altering a transfer function of the second filter from 10 Hz to 10 kHz.

20. The article of manufacture of claim 16 wherein adapting the second filter and not the first filter comprises
maintaining the first filter fixed while adapting the second based on the updated transfer function.

\* \* \* \* \*